(12) United States Patent
Kimura et al.

(10) Patent No.: US 8,460,010 B2
(45) Date of Patent: Jun. 11, 2013

(54) CONTACT AND ELECTRICAL CONNECTING APPARATUS

(75) Inventors: Ken Kimura, Tokyo (JP); Katsuyuki Kakizaki, Tokyo (JP); Eichi Osato, Tokyo (JP); Masashi Hasegawa, Tokyo (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 13 days.

(21) Appl. No.: 13/384,771

(22) PCT Filed: Jul. 21, 2010

(86) PCT No.: PCT/JP2010/062251
§ 371 (c)(1),
(2), (4) Date: Jan. 19, 2012

(87) PCT Pub. No.: WO2011/036935
PCT Pub. Date: Mar. 31, 2011

(65) Prior Publication Data
US 2012/0129408 A1    May 24, 2012

Related U.S. Application Data

(63) Continuation-in-part of application No. PCT/JP2007/066787, filed on Sep. 28, 2009.

(51) Int. Cl.
*H01R 12/00* (2006.01)
(52) U.S. Cl.
USPC .......................................................... 439/66

(58) Field of Classification Search
USPC .................. 439/66, 816, 131, 700, 76, 77
See application file for complete search history.

(56) References Cited

U.S. PATENT DOCUMENTS

| 4,029,375 | A * | 6/1977 | Gabrielian | 439/66 |
| 7,025,602 | B1 * | 4/2006 | Hwang | 439/66 |
| 7,677,901 | B1 * | 3/2010 | Suzuki et al. | 439/66 |
| 8,373,430 | B1 * | 2/2013 | Sochor | 324/755.05 |

FOREIGN PATENT DOCUMENTS

| JP | 11-317270 A | 11/1999 |
| JP | 2004-152495 A | 5/2004 |
| JP | 2006-139977 A | 1/2006 |
| JP | 2008-275421 A | 11/2008 |
| WO | WO-2006/041807 A2 | 4/2006 |

* cited by examiner

*Primary Examiner* — Tulsidas C Patel
*Assistant Examiner* — Phuongchi T Nguyen
(74) *Attorney, Agent, or Firm* — Bacon & Thomas, PLLC

(57) ABSTRACT

A contact according to the present invention comprises a plate-shaped first plunger contacting one member, a plate-shaped second plunger contacting the other member in a state of being overlapped with the first plunger and conducting electricity between the one member and the other member in cooperation with the first plunger, and a compression coil spring which is a member coupling the first plunger with the second plunger in a state where contact pieces thereof are in opposite directions from each other, covering outer circumferences of coupling portions of the first plunger and the second plunger, abutting on spring receiving portions of the respective plungers, and supporting the respective plungers to be relatively slidable. In an electrical connecting apparatus, the contacts are incorporated.

9 Claims, 15 Drawing Sheets

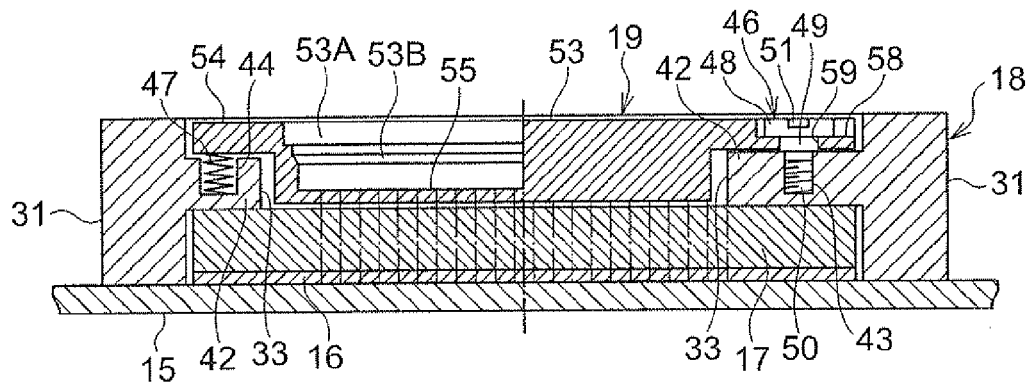
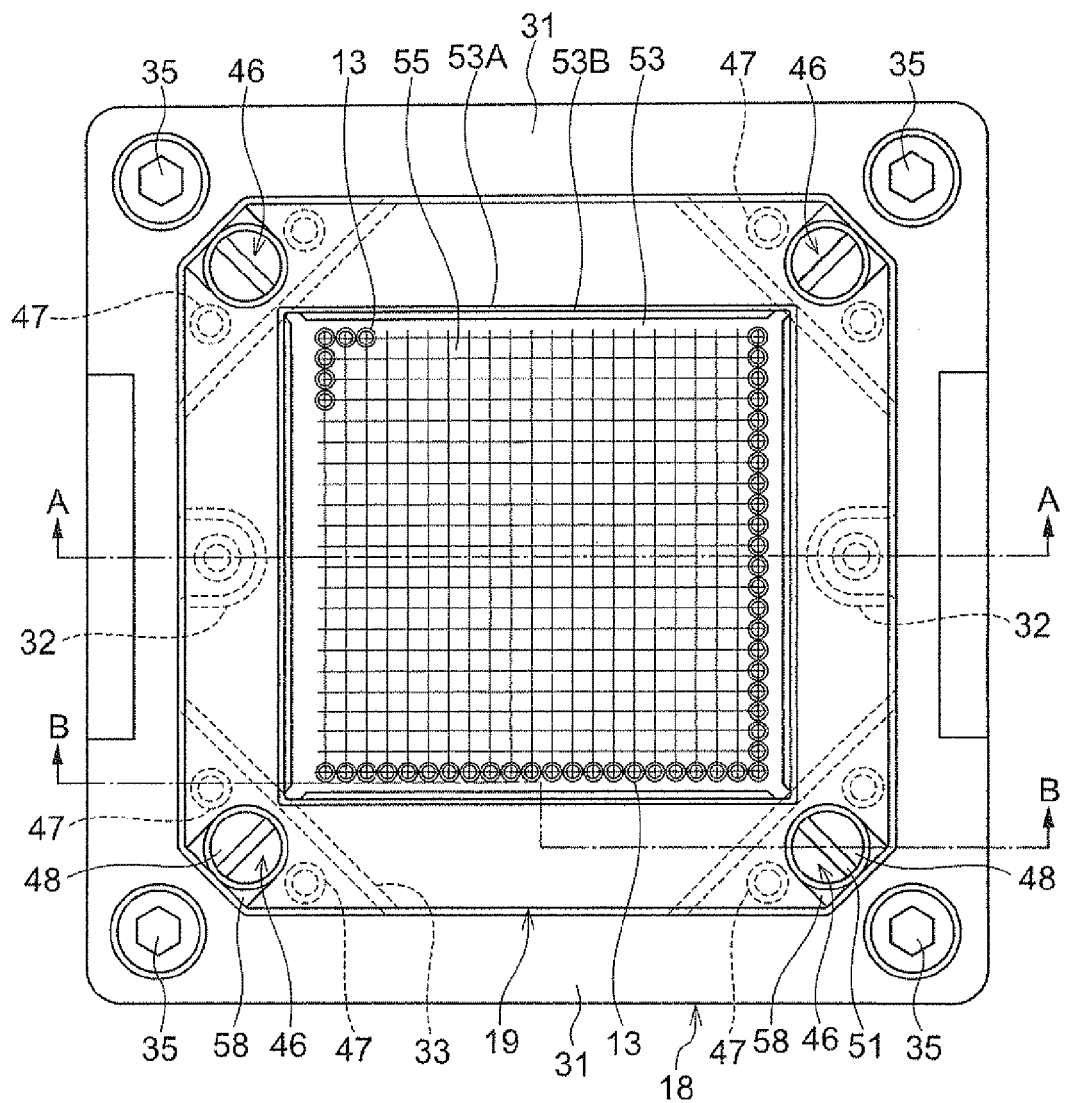

CONTACT AND ELECTRICAL CONNECTING APPARATUS

TECHNICAL FIELD

The present invention relates to a contact that contacts an electrode provided on a wiring board, a semiconductor integrated circuit, or the like and an electrical connecting apparatus.

BACKGROUND ART

A contact that electrically and mutually connects electrical circuits or the like of wiring boards disposed to be opposed to each other is generally known. Examples of such a contact are ones described in Patent Document 1 and Patent Document 2.

A contact 1 in Patent Document 1 includes two contact pins 2 having equal shapes and a coil spring 3 as shown in FIGS. 2 and 3.

The contact pin 2 mainly includes locking claws 4, a locking hole 5, a flange portion 6, and a pin tip end portion 2A. Two locking claws 4 are provided to be opposed to each other and are supported by resilient supporting bar portions 4A. This allows the two locking claws 4 to approach to and separate from each other. The locking hole 5 is a hole in which the locking claws 4 are fitted and is formed in a rectangular shape so as to be matched with the width of the locking claws 4. Thus, by making the two contact pins 2 opposed to each other to be displaced by 90 degrees and fitted in each other, two pairs of locking claws 4 are respectively locked in the openings of the locking holes 5 to be prevented from falling off. The flange portion 6 is a part on which the coil spring 3 is to abut. By making the two contact pins 2 displaced by 90 degrees and fitted in each other in a state of being inserted in the coil spring 3, both the ends of the coil spring 3 abut on the respective flange portions 6 to assemble the contact 1. Both the ends of the contact 1 assembled in a state where the two contact pins 2 are fitted in each other are the pin tip end portions 2A that contact electrodes or the like and are electrically connected to them.

Also, a contact 7 in Patent Document 2 includes a plunger 8 and a spring 9 as shown in FIG. 4.

The plunger 8 is formed in an elongated plate shape and is provided at the upper portion with a broad portion 8A receiving the spring 9, and at the upper portion of this broad portion 8A is formed a terminal portion 8B contacting an electrode. At the lower portion of the broad portion 8A is formed a core bar portion 8C inserted in the spring 9 to be movable up and down. The spring 9 is formed to have an inside diameter that allows the core bar portion 8C to be inserted to be movable up and down. The lower end portion of the spring 9 is tapered to be brought into contact with an electrode or the like.

Also, there is one having a structure as in Patent Document 3. A socket for an electrical component in Patent Document 3 has a contact member contacting a terminal of an electrical component, a board conducting member made of a conductive plate material and connected to a printed circuit board, and a coil spring disposed between the contact member and the board conducting member for conduction between them. The contact member and the board conducting member are not brought into contact with each other and are connected with the coil spring inbetween.

Patent Document 1: Japanese Patent National Publication No. 2008-516398

Patent Document 2: Japanese Patent Laid-Open. No. 2004-152495

Patent Document 3: Japanese Patent Laid-Open No. H11-317270

DISCLOSURE OF THE INVENTION

Problems to be Solved by the Invention

However, in the contact 1 in Patent Document 1 described above, when the locking claws 4 contact the circumference of the locking hole 5 a number of times along with expansion and contraction of the contact 1 in a state where the locking claws 4 of one contact pin 2 are fitted in the locking hole 5 of the other contact pin 2, the locking claws 4 and the supporting bar portions 4A may be damaged by abrasion or the like and lack durability.

Also, the respective contact pins 2 have a small mutual contact area as the locking claws 4 are just fitted in the locking hole 5 of the other side, and thus the coil spring 3 mainly bears electrical connection. However, since the locking claws 4 and parts of the supporting bar portions 4A need to expand and be fitted in the locking hole 5 of the other side in a state of being inserted in the coil spring 3, it is difficult to set the inside diameter of the coil spring 3 so small as to allow the coil spring 3 to tighten the contact pins 2. Also, since the coil spring 3 is a compression spring and has a small number of contact points with the contact pins 2, each contact pin 2 and the coil spring 3 has a small degree of adhesion therebetween. Accordingly, a contact part between the flange portion 6 of each contact pin 2 and the coil spring 3 is a main electrical flowing path but has a small contact area to easily cause abrasion, corrosion or the like and has poor electrical contact characteristics. This causes a problem of easily bringing about a contact failure and lacking durability.

Also, in the contact 7 in Patent Document 2, since the inside diameter of the spring 9 is set to a dimension that allows the core bar portion 8C of the plunger 8 to be inserted to be movable up and down, the plunger 8 and the spring 9 sometimes contact each other and sometimes do not and have poor electrical contact characteristics. Accordingly, a contact point between the broad portion 8A of the plunger 8 and the upper end portion of the spring 9 is mainly a part that electrically connects the plunger 8 to the spring 9. Thus, a contact area is small, which causes a problem of easily bringing about a contact failure due to abrasion, corrosion or the like, having poor electrical contact characteristics, and lacking durability.

Further, in the case of Patent Document 3, since the plungers do not contact each other and just electrically brought into contact with each other by the spring, there is a problem of poor electrical contact characteristics.

The present invention has been made with a view to such problems, and an object of the present invention is to provide a contact having improved durability at low cost by improving electrical contact characteristics, and an electrical connecting apparatus using this contact.

Means to Solve the Problems

A contact according to the present invention is made to solve the above problems and comprises a plate-shaped first plunger contacting one member, a plate-shaped second plunger contacting the other member in a state of being overlapped with the first plunger and conducting electricity between the one member and the other member in cooperation with the first plunger, and a compression coil spring which is a member coupling the first plunger with the second plunger, covering outer circumferences of coupling portions of the first plunger and the second plunger, abutting on spring receiving portions of the respective plungers, and supporting the respective plungers to be relatively slidable.

Also, an electrical connecting apparatus according to the present invention is an electrical connecting apparatus contacting electrodes of a device under test and performing a test, comprises contacts disposed at positions corresponding to the respective electrodes of the device under test and contacting the respective electrodes for electrical conduction, and uses the aforementioned contacts as the contacts.

Effect of the Invention

In the contact and the electrical connecting apparatus according to the present invention, the first plunger and the second plunger collaboratively conduct electricity between the one member and the other member in a state where the coupling portion of the first plunger and the coupling portion of the second plunger are overlapped and electrically conducted. Accordingly, electrical contact characteristics are improved, and durability is improved. In addition, the number of parts is reduced, and cost reduction is enabled.

BRIEF DESCRIPTION OF THE DRAWINGS

FIG. 6 is a cross-sectional view (cross-sectional view taken along arrow B-B of FIG. 7) showing the electrical connecting apparatus according to the first embodiment of the present invention.

FIG. 7 is a plan view showing the electrical connecting apparatus according to the first embodiment of the present invention.

EXPLANATIONS OF REFERENCE NUMERALS

11: electrical connecting apparatus, 12: device under test, 13: bump electrode, 15: wiring board, 16: lower housing, 16A: first supporting hole, 16B: lower receiving portion, 17: upper housing, 17A: second supporting hole, 17B: upper receiving portion, 18: frame, 19: guide plate, 20: contact, 22: contact pad, 23: pin head fitting hole, 27: contact supporting hole, 28: pin shaft fitting hole, 31: outer frame portion, 32: fixing flange portion, 33: up-down movement supporting flange portion, 35: fixing screw, 37: guide pin, 38: pin hole, 39: head, 40: shaft, 42: plate portion, 43: guide screw hole, 44: spring hole, 46: guide screw, 47: spring, 48: head, 49: guide portion, 50: screw bar portion, 51: minus groove, 53: receiving recess portion, 53A: upper opening, 53B: sloped surface, 54: flange portion, 55: bottom plate portion, 56: guide hole, 57: narrowing portion, 58: counter boring portion, 62: first plunger, 63: second plunger, 64: compression coil spring, 66: coupling portion, 67: spring receiving portion, 68: contact piece, 69: coupling bar portion, 70: tip end inserting portion, 71: falling preventing portion, 73: lower supporting shoulder portion, 75: coupling portion, 76: spring receiving portion, 77: contact piece, 77A: projection, 77B: tapered surface, 79: upper supporting shoulder portion, 80: coupling bar portion, 81: tip end inserting portion, 82: falling preventing portion, 84: adhesion small-diameter portion, 86: contact, 87: first plunger, 88: insulator, 89: contact pad, 90: contact, 91: second plunger, 92: contact piece, 92A: projection, 92B: tapered surface, 92C, 92D: projection bar portion, 93: slit, 94: stopping hole, 95: slit

BEST MODE FOR CARRYING OUT THE INVENTION

Hereinafter, a contact and an electrical connecting apparatus according to embodiments of the present invention will be described with reference to the attached drawings.

First Embodiment

First, an electrical connecting apparatus 11 of the present embodiment will be described based on FIGS. 5 to 9. The electrical connecting apparatus 11 is an apparatus for use in an electrical test or the like of a device under test 12. The device under test 12 is a semiconductor device such as an integrated circuit. The device under test 12 is provided on the lower side surface with a plurality of bump electrodes 13 (see FIG. 8). The bump electrodes 13 are electrodes provided on the lower side surface of the device under test 12. The respective bump electrodes 13 are arranged on the lower side surface of the device under test 12 in a single line, in plural lines, in a matrix form, or in another arrangement.

Figure 8:
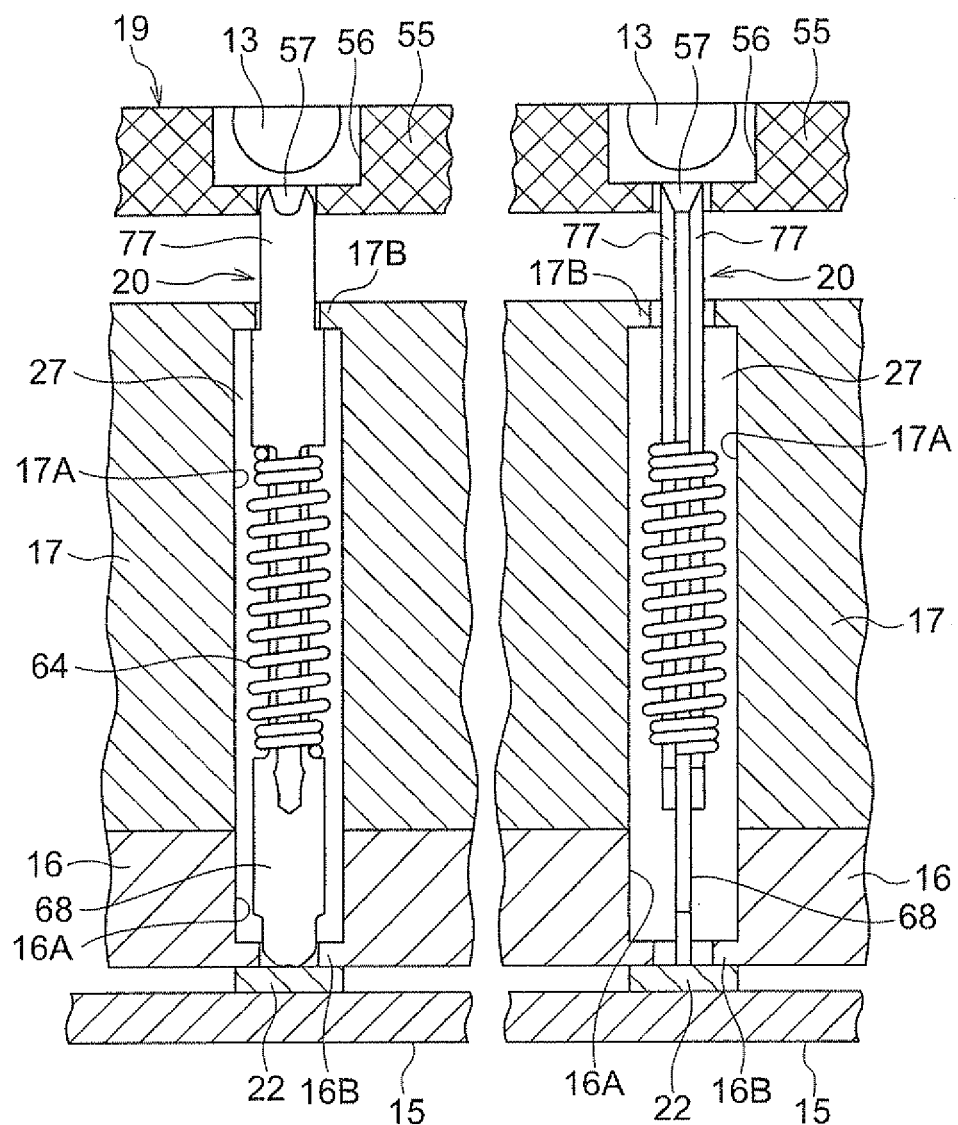
FIG. 8 shows main part enlarged cross-sectional views each showing a contact mounting part of the electrical connecting apparatus according to the first embodiment of the present invention, which are a front cross-sectional view and a side cross-sectional view each showing a state where a contact does not contact an electrode of a device under test.

The electrical connecting apparatus 11 is mainly configured to include a wiring board 15, a lower housing 16, an upper housing 17, a frame 18, a guide plate 19, and contacts 20 (see FIG. 8).

The wiring board 15 is a plate-shaped wiring board supporting the lower housing 16, the upper housing 17, and the like. Wires of this wiring board 15 are connected to wires of a tester main body (not shown) testing the device under test. The wiring board 15 is a member constituting electrodes on the side of the tester main body, and the lower end portions of the contacts 20 contact contact pads 22 provided on the upper surface of the wiring board 15 for electrical conduction.

The lower housing 16 is a member to support the contacts 20 in a state of being coupled with the upper housing 17. The lower housing 16 is provided with first supporting holes 16A in which the lower end portions of the contacts 20 are to be inserted to each have a slightly larger diameter than the outside diameter of each contact 20. The first supporting holes 16A are respectively provided at positions corresponding to the respective bump electrodes 13 on the lower surface of the device under test 12. In each of the first supporting holes 16A is formed a lower receiving portion 16B receiving and supporting each contact 20. The lower receiving portion 16B is formed to decrease the inside diameter of the lower end portion of the first supporting hole 16A. The inside diameter of the lower receiving portion 16B is set so that an after-mentioned lower supporting shoulder portion 73 of the contact 20 may hang on this lower receiving portion 16B, and so that the lower end portion of the contact 20 may pass through the lower receiving portion 16B. The contact 20 is adapted to be supported at the lower receiving portion 16B by the fact that the lower supporting shoulder portion 73 of the contact 20 hangs on this lower receiving portion 16B.

The lower housing 16 is piled on the upper side of the wiring board 15. The upper side surface of the wiring board 15 is provided at positions corresponding to the first supporting holes 16A with the contact pads 22 connected to the tester main body by the wires. On each contact pad 22 is thrust the lower end portion of the contact 20 inserted in the first supporting hole 16A for electrical contact.

Figure 1:
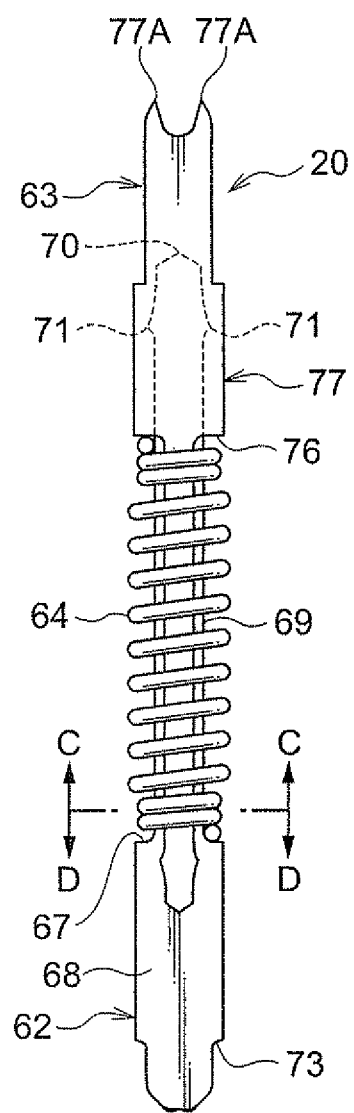
FIG. 1 is a front view showing a contact according to a first embodiment of the present invention.
Figure 2:
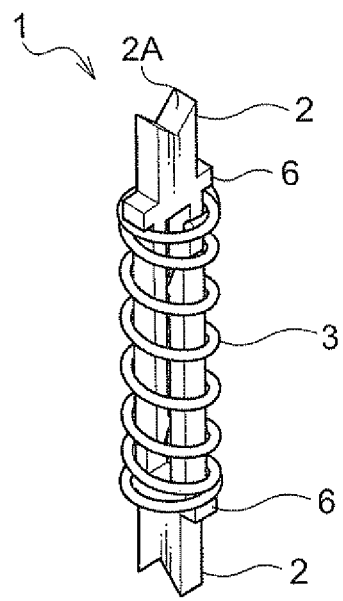
FIG. 2 is a perspective view showing a first conventional contact.
Figure 3:
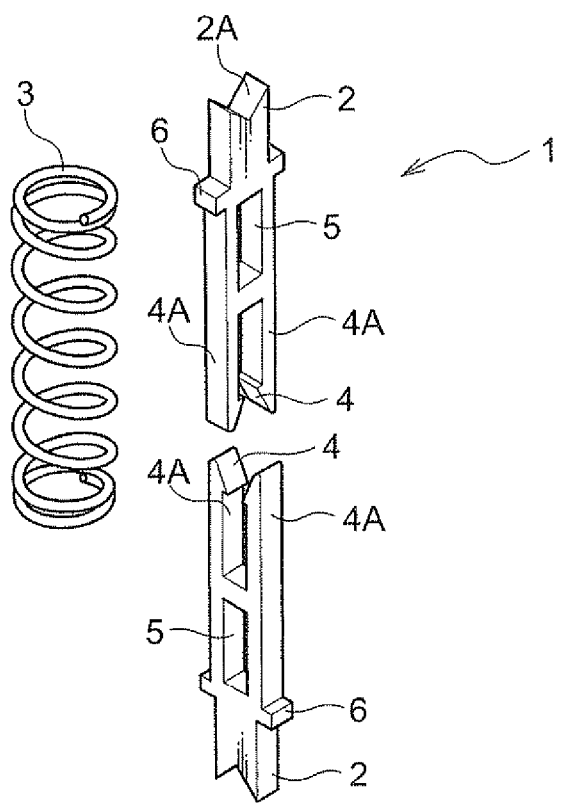
FIG. 3 is an exploded perspective view showing the first conventional contact.
Figure 4A:
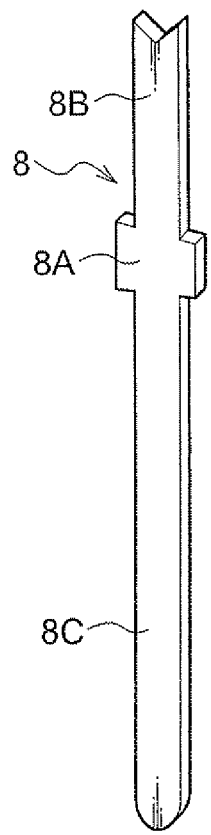
FIG. 4 shows perspective views showing a second conventional contact.
Figure 4B:
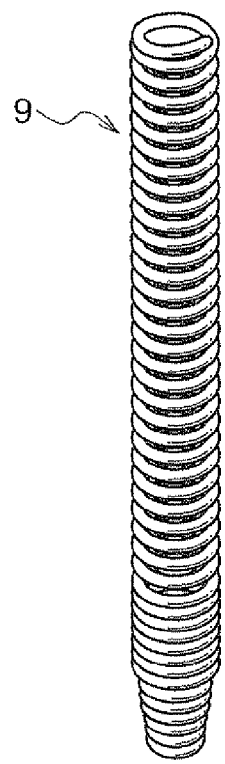
Figure 4C:
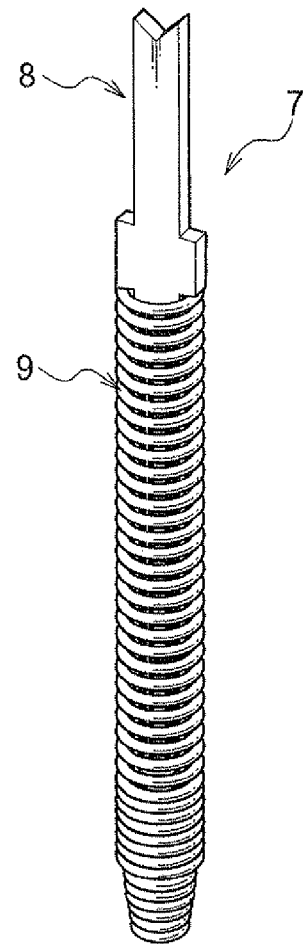
Figure 5:
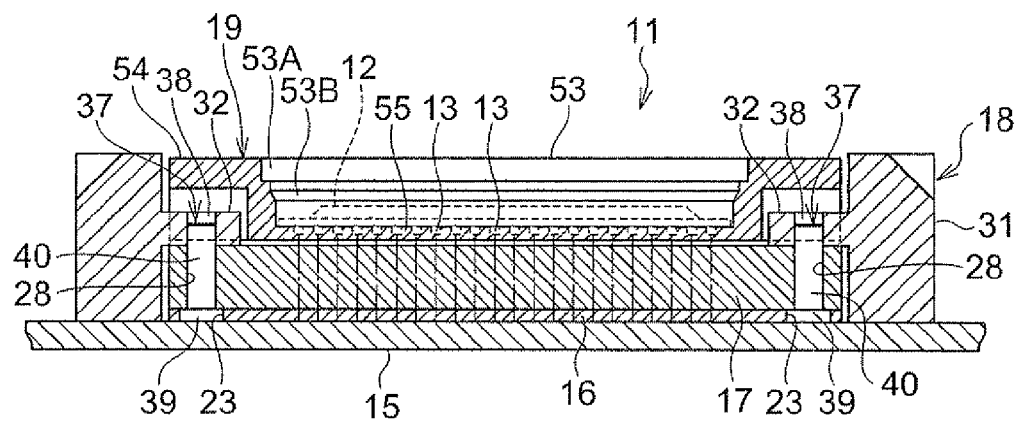
FIG. 5 is a cross-sectional view (cross-sectional view taken along arrow A-A of FIG. 7) showing an electrical connecting apparatus according to a first embodiment of the present invention.

The lower housing 16 is provided with pin head fitting holes 23 (see FIG. 5). The pin head fitting holes 23 are holes in which heads 39 of after-mentioned guide pins 37 are fitted. The inside diameter of each pin head fitting hole 23 is set to have an approximately equal dimension to the outside diameter of the head 39 of the guide pin 37 so that the head 39 of the guide pin 37 may be fitted without allowance.

The upper housing 17 is a member to support the contacts 20 entirely in cooperation with the lower housing 16. The upper housing 17 is piled on the lower housing 16 so that the lower housing 16 and the upper housing 17 may support the contacts 20 in a state where the contacts 20 can expand and contract freely. The upper housing 17 is provided at positions corresponding to the first supporting holes 16A of the lower housing 16 with second supporting holes 17A. Each of the second supporting holes 17A is formed to have an equal inside diameter (diameter that is slightly larger than the outside diameter of the contact 20) to the upper opening of the first supporting hole 16A and slidably houses and supports the contact 20 therein. The second supporting holes 17A are respectively provided at positions corresponding to the respective bump electrodes 13 provided on the lower side surface of the device under test 12 so that the upper end portions of the respective contacts 20 may electrically contact the respective bump electrodes 13.

In each of the second supporting holes 17A is formed an upper receiving portion 17B supporting each contact 20 from the upper side. The upper receiving portion 17B is formed to decrease the inside diameter of the upper end portion of the second supporting hole 17A. The inside diameter of the upper receiving portion 17B is set so that an after-mentioned upper supporting shoulder portion 79 of the contact 20 may hang on this upper receiving portion 17B, and so that the upper end portion of the contact 20 may pass through the upper receiving portion 17B, to make the contact 20 supported at the upper receiving portion 17B.

The first supporting hole 16A and the second supporting hole 17A constitute a contact supporting hole 27 receiving and supporting the entirety of the contact 20. When the contact 20 is in a state of being received in the contact supporting hole 27, the contact 20 is in a precompressed state (contracted state), and the lower end portion of the contact 20 is in a state of thrusting the contact pad 22 provided on the upper surface of the wiring board 15.

The upper housing 17 is provided with pin shaft fitting holes 28 (see FIG. 5). The pin shaft fitting holes 28 are holes in which shafts 40 of the after-mentioned guide pins 37 are fitted. The inside diameter of each pin shaft fitting hole 28 is set to have an approximately equal dimension to the outside diameter of the shaft 40 of the guide pin 37 so that the shaft 40 of the guide pin 37 may be fitted without allowance.

The frame 18 is a member to integrally fix and support the wiring board 15, the lower housing 16, and the upper housing 17 and to support the guide plate 19 to be movable up and down. The frame 18 includes an outer frame portion 31, fixing flange portions 32, and up-down movement supporting flange portions 33.

The outer frame portion 31 is formed in a quadrangular frame shape so as to surround the circumferential portions of the lower housing 16, the upper housing 17, and the guide plate 19. The lower side surface of the outer frame portion 31 is provided with a positioning pin or a positioning hole (not shown) while the upper side surface of the wiring board 15 is provided with a positioning hole or a positioning pin (not shown) to correspond to the positioning pin or the positioning hole on the side of the outer frame portion 31. By doing so, the positioning pin or the positioning hole on the lower side surface of the outer frame portion 31 is fitted in/with the positioning hole or the positioning pin on the upper side surface of the wiring board 15 so that the outer frame portion 31 and the wiring board 15 may be positioned and supported accurately. Fixing screws 35 (see FIG. 7) are attached to the four corners of the outer frame portion 31. The fixing screws 35 are screwed into screw holes (not shown) of the wiring board 15 via through holes (not shown) at the four corners of the outer frame portion 31 to fix the outer frame portion 31 and the wiring board 15.

Two fixing flange portions 32 are provided to be opposed to each other on the inner side surfaces of the opposed sides (frame) of the opening portion of the quadrangular outer frame portion 31. The respective fixing flange portions 32 are formed approximately in semicircular plate shapes mutually extending inward horizontally. The height of the lower surface of each of the fixing flange portions 32 (height from the wiring board 15) is set to have an approximately equal value to the height of the piled lower housing 16 and upper housing 17. This causes the lower housing 16 and the upper housing 17 piled on the wiring board 15 to be sandwiched and supported between the respective fixing flange portions 32 and the wiring board 15. Specifically, when the upper housing 17 and the lower housing 16 are put under the fixing flange portions 32, the lower surface of the lower housing is on the same level as the lower surface of the outer frame portion 31.

At the center of each fixing flange portion 32 is formed a pin hole 38 in which the guide pin 37 is fitted. The inside diameter of the pin hole 38 is set to have an approximately equal dimension to the outside diameter of the shaft 40 of the guide pin 37.

Meanwhile, the guide pin 37 includes the head 39 and the shaft 40. The head 39 is formed in a disk shape having an approximately equal outside diameter to the inside diameter of the pin head fitting hole 23 of the lower housing 16. The shaft 40 is formed in a circular bar shape having an approximately equal outside diameter to the inside diameters of the pin shaft fitting hole 28 of the upper housing 17 and the pin hole 38 of the fixing flange portion 32.

The pin head fitting hole 23 of the lower housing 16, the pin shaft fitting hole 28 of the upper housing 17, and the pin hole 38 of the fixing flange portion 32 are provided coaxially by allowing the guide pin 37 to path therethrough.

Thus, the head 39 of the guide pin 37 is fitted in the pin head fitting hole 23 of the lower housing 16, and the shaft 40 is fitted in the pin shaft fitting hole 28 of the upper housing 17 and the pin hole 38 of the fixing flange portion 32, to position the lower housing 16, the upper housing 17, and the frame 18. In addition, by sandwiching the lower housing 16 and the upper housing 17 from the upper and lower sides between the lower surfaces of the respective fixing flange portions 32 of the frame 18 and the wiring board 15 and supporting them in the opening of the frame 18, the wiring board 15, the lower housing 16, the upper housing 17, and the frame 18 are positioned to one another accurately and fixed integrally.

The up-down movement supporting flange portions 33 are parts to support the guide plate 19 to be movable up and down in the opening of the frame 18. The up-down movement supporting flange portions 33 are formed respectively at the four corners of the opening portion of the quadrangular frame-shaped frame 18. Each of the up-down movement supporting flange portions 33 includes a plate portion 42, a guide screw hole 43, and spring holes 44.

The plate portions 42 are plate members bridged obliquely at the four corners of the outer frame portion 31 of the frame 18. The height of the lower side surface of the plate portion 42 is set to have an equal height to the lower side surface of the fixing flange portion 32. The height of the upper side surface of the plate portion 42 is set so that the upper side surface of the plate, portion 42 and the lower side surface of a flange portion 54 of the guide plate 19 may abut on each other to cause the bump electrodes 13 of the device under test 12 and the upper end portions of the contacts 20 to contact optimally. Specifically, the height of the upper side surface of the plate portion 42 is set to bring a state in which the bump electrodes 13 of the device under test 12 contacts the upper end portions of the contacts 20, and in which the contacts 20 are contracted (state in FIG. 9).

The plate portion 42 is provided with the guide screw hole 43 and the spring holes 44. The guide screw hole 43 is a screw hole in which a guide screw 46 is screwed. One guide screw hole 43 is provided at the center of each plate portion 42 (see FIG. 7). The spring hole 44 is a hole to support a spring 47. Two spring holes 44 are provided on both sides of each guide screw hole 43.

The guide screw 46 is a screw to position the guide plate 19 in the opening of the frame 18 and allow up-down movement of the guide plate 19. The guide screw 46 includes a head 48, a guide portion 49, and a screw bar portion 50.

The head 48 is a part to suppress the guide plate 19 and prevent it from falling off. On the upper side surface of the head 48 is formed a minus groove 51 in which a flat-blade screwdriver is to be fitted.

The guide portion 49 is a part to guide up-down movement of the guide plate 19. The guide portion 49 is provided between the head 48 and the screw bar portion 50 and is fitted in a guide hole 59 of the guide plate 19 to guide up-down movement of the guide plate 19. The length (height) of the guide portion 49 is set so that the upper end portion of each contact 20 may be received in a narrowing portion 57 of the guide plate 19 (so as to bring a state in FIG. 8) in a state where the lower surface of the head 48 contacts the guide plate 19 and is supported (a state where the guide plate 19 is pressed up by the springs 47).

The screw bar portion 50 is a part to fix the guide screw 46 in the plate portion 42. The screw bar portion 50 is screwed in the guide screw hole 43 of the plate portion 42 to fix the guide screw 46 in the plate portion 42.

The spring 47 is a member to elastically support the guide plate 19. The spring 47 is mounted in the spring hole 44 of the plate portion 42 and abuts on the rear surface of the flange portion 54 of the guide plate 19. Thus, a total of eight springs 47 bias the guide plate 19, which is supported to be movable up and down by the guide portions 49 of the four guide screws 46, from the lower side. By doing so, the flange portions 54 of the guide plate 19 are pressed upward until they contact the lower surfaces of the heads 48 of the guide screws 46 to bring a standby state before contact.

The guide plate 19 is a member to position and support the device under test 12 and align the respective bump electrodes 13 of the device under test 12 with the respective contacts 20 when the device under test 12 is mounted in the electrical connecting apparatus 11. The guide plate 19 includes a receiving recess portion 53 and the flange portions 54.

The receiving recess portion 53 is a part to receive and support the device under test 12. The receiving recess portion 53 is formed approximately in a rectangular dish shape. The inside bottom portion of the receiving recess portion 53 is formed in a quadrangular shape, and a dimension thereof is set to be slightly larger than that of the device under test 12. It is to be noted that, although the inside bottom portion of the receiving recess portion 53 is formed in a quadrangular shape since the device under test 12 is a quadrangle, the inside bottom portion of the receiving recess portion 53 is formed to match the shape of the device under test 12 in a case where the device under test 12 is in another shape.

This allows the device under test 12 to be positioned in a state where the device under test 12 is mounted on the inside bottom portion of the receiving recess portion 53. A bottom plate portion 55 of the receiving recess portion 53 is provided with multiple guide holes 56. The guide holes 56 are openings to guide and receive the respective bump electrodes 13 of the device under test 12. Each guide hole 56 is formed to be slightly larger than the bump electrode 13 so as to receive the bump electrode 13 easily. In other words, making the device under test 12 received in the receiving recess portion 53 enables the respective bump electrodes 13 of the device under test 12 to be fitted in the respective guide holes 56 from the upper sides easily.

At the lower end portion of the guide hole 56 is formed the narrowing portion 57 that does not let the bump electrode 13 pass therethrough and receives the upper end portion of the contact 20. The narrowing portion 57 receives the upper end portion of the contact 20 and allows it to pass therethrough to enable the contact 20 to contact the bump electrode 13.

On the lower side of an upper opening 53A of the receiving recess portion 53, a sloped surface 53B is formed. The sloped surface 53B is a surface to guide the device under test 12 to the bottom portion of the receiving recess portion 53.

The flange portions 54 are formed at the four corners of the receiving recess portion 53 at positions corresponding to the up-down movement supporting flange portions 33 of the frame 18. Each of the flange portions 54 is provided with a counter boring portion 58 on which the head 48 of the guide screw 46 abuts. The counter boring portion 58 is provided with the guide hole 59 fitted with the guide portion 49 of the guide screw 46 to be movable up and down. Thus, the guide hole 59 of the flange portion 54 is fitted with the guide portion 49 of the guide screw 46 to be movable up and down, and the guide plate 19 is excited upward by the springs 47. In this state, by mounting the device under test 12 in the receiving recess portion 53 and pressing it downward, the guide plate 19 is pressed down, and the bump electrodes 13 of the device under test 12 contacts the upper end portions of the contacts 20 to perform a test.

The contact 20 includes a first plunger 62, two second plungers 63, and a compression coil spring 64 as shown in FIGS. 1 and 10 to 15.

The first plunger 62 is a plate-shaped plunger to contact an electrode or the like (contact pad 22 of the wiring board 15 herein) as one member and is made of a conductive material by cutting work, press work, or plating with use of a photo-lithographic technique. One first plunger 62 is provided. The first plunger 62 includes a coupling portion 66, a spring receiving portion 67, and a contact piece 68 (see FIG. 13). The length of the first plunger 62 is approximately equal to the height dimension from the contact pad 22 of the wiring board 15 to the upper surface of the upper housing 17 when the first plunger 62 is incorporated in the electrical connecting apparatus 11.

The coupling portion 66 is a part to be directly overlapped to bring the first plunger 62 and the second plungers 63 into electrical contact with one another when the first plunger 62 and the two second plungers 63 are coupled with one another. The coupling portion 66 includes a coupling bar portion 69, a tip end inserting portion 70, and a falling preventing portion 71.

The coupling portion 66 is formed in an elongated plate shape and can contact the second plungers 63 in a stable manner with the largest possible area. The coupling bar portion 69 is a part to be supported by the after-mentioned compression coil spring 64 and is set to have a slightly longer dimension than that of the compression coil spring 64.

The width dimension of the coupling bar portion 69 is set to be an approximately equal dimension to the inside diameter of an adhesion small-diameter portion 84 of the compression coil spring 64. That is, the coupling bar portion 69 and the adhesion small-diameter portion 84 are combined in a state in which the four corner portions of the cross-sectional shape of the coupling bar portion 69 contact the inside diameter portion of the adhesion small-diameter portion 84 of the compression coil spring 64 and in a state in which the inside diameter portion of the adhesion small-diameter portion 84 of the compression coil spring 64 becomes a circumscribed circle of the coupling bar portion 69 and slightly tightens the coupling bar portion 69 (see FIGS. 11 and 12).

The tip end inserting portion 70 is a part to guide insertion of the coupling bar portion 69 in the compression coil spring 64 at the time of assembling. The tip end inserting portion 70 is formed at the tip end portion (upper end portion in FIG. 13) of the coupling bar portion 69. The tip end inserting portion 70 has a gentle and curved sloped surface not to be an obstacle in an inserting direction to facilitate insertion in the compression coil spring 64. Also, the thickness dimension of the coupling portion 66 is set so that the tip end inserting portion 70 may be located between after-mentioned contact pieces 77 of the two second plungers 63 when the coupling portion 66 is combined to stabilize the distance between projections 77A of the contact pieces 77.

The falling preventing portion 71 is a part to prevent the tip end inserting portion 70 from falling off from the compression coil spring 64 when the tip end inserting portion 70 is inserted in the compression coil spring 64. The falling preventing portion 71 is provided at the proximal end portion (border part between the coupling bar portion 69 and the tip end inserting portion 70) of the tip end inserting portion 70. That is, the falling preventing portion 71 is formed at an end portion opposite the spring receiving portion 67. The falling preventing portion 71 is formed by projecting the proximal end portion of the tip end inserting portion 70 to both sides. The width of the falling preventing portion 71 projected to both sides is set to be slightly protruded from the inside diameter of the adhesion small-diameter portion 84 at the end portion of the compression coil spring 64 (see FIG. 11).

The spring receiving portion 67 is a part to receive the compression coil spring 64. The spring receiving portion 67 is a step provided at a border part between the coupling portion 66 and the contact piece 68. The contact piece 68 is formed to have a larger width than the width of the coupling portion 66, and a step part at their border is the spring receiving portion 67. The adhesion small-diameter portion 84 at the end portion of the compression coil spring 64 abuts on this spring receiving portion 67 to cause the first plunger 62 to be elastically supported in the contact 22 by the compression coil spring 64.

The contact piece 68 is a member to contact one member (contact pad 22 of the wiring board 15) and be electrically connected to it. The contact piece 68 is provided integrally following the proximal end side (lower side in FIG. 13) of the coupling portion 66. The contact piece 68 is formed by an approximately rectangular plate-shaped portion whose width dimension is a slightly smaller dimension than the inside diameters of the first supporting hole 16A of the lower housing 16 and the second supporting hole 17A of the upper housing 17 and a tip end portion following it, passing through the lower receiving portion 16B of the lower housing 16, and having a smaller width dimension than that of the rectangular plate-shaped portion. The tip end portion of the contact piece 68 is formed to be curved so as to contact the flat-surface-shaped contact pad 22 of the wiring board 15 in a stable manner. In the contact piece 68, the lower supporting shoulder portion 73 is formed at the border between the rectangular plate-shaped portion and the tip end portion. This lower supporting shoulder portion 73 hangs on the lower receiving portion 168 of the lower housing 16 to prevent the contact piece 68 from falling off from the first supporting hole 16A. In a state where the lower supporting shoulder portion 73 hangs on the lower receiving portion 16B of the lower housing 16, the end portion (lower end portion in FIGS. 8 and 9) of the contact piece 68 is adapted to protrude downward from the first supporting hole 16A.

The second plungers 63 are plate-shaped plungers to conduct electricity, between one member (contact pad 22 of the wiring board 15) and the other member (bump electrode 13) in cooperation with the first plunger 62 and are made of a conductive material by cutting work, press work, or plating with use of a photolithographic technique. Each of the second plungers 63 includes a coupling portion 75, a spring receiving portion 76, and the contact piece 77 (see FIG. 14).

Two second plungers 63 are provided and are combined by the compression coil spring 64 to sandwich the first plunger 62 inbetween. They sandwich the coupling portion 66 of the first plunger 62 in a state where the respective coupling portions 75 of the two second plungers 63 are opposed to each other. Thus, in a state where one first plunger 62 and two second plungers 63 are electrically connected to be conductive, the plungers 62 and 63 respectively contact the contact pad 22 and the bump electrode 13 to conduct electricity between them.

The two second plungers 63 are formed in equal shapes. Making the plungers of the equal shapes opposed enables favorable contact with a member to contact (bump electrode 13). The respective second plungers 63 are adapted to slide independently of each other in a state of sandwiching the first plunger 62. The reason for this is that, in a case where the shape of the member to contact (bump electrode 13) is uneven or in a ball shape, the second plungers 63 follow the shape for reliable electrical contact.

The coupling portions 75 are parts to be overlapped with the coupling portion 66 of the first plunger 62 to electrically contact it when the first plunger 62 and the second plungers 63 are coupled with one another. That is, the coupling portions 75 of the two second plungers 63 are overlapped to sandwich the coupling portion 66 of the first plunger 62 from both sides to bring the first plunger 62 and the second plungers 63 into electrical contact with one another. Each of the coupling portions 75 includes a coupling bar portion 80, a tip end inserting portion 81, and a falling preventing portion 82.

The coupling portion 75 is formed in an elongated plate shape and can contact the coupling portion 66 of the first plunger 62 with a large area.

The coupling bar portion 80 is a part to be overlapped with the coupling portion 66 of the first plunger 62 and be supported by the compression coil spring 64 and is set to have a slightly longer dimension than that of the compression coil spring 64.

The cross-sectional dimension (width and thickness dimensions) of the coupling bar portion 80 is a dimension in a state where, in a state where the two coupling bar portions 80 sandwich the coupling bar portion 69 of the first plunger 62 from both sides, the eight corner portions (see FIG. 11) of the cross-sectional shapes of one coupling bar portion 69 and two coupling bar portions 80 sandwiching it contact the inside diameter portion of the adhesion small-diameter portion 84 of the compression coil spring 64. That is, the coupling bar portions 80 and the adhesion small-diameter portion 84 are combined in a state in which the inside diameter of the adhesion small-diameter portion 84 of the compression coil spring 64 is set to be a dimension to become a circumscribed circle of the cross-sectional shape into which the coupling bar portions 80, 69, and 80 are coupled and slightly tightens the coupling bar portions 80, 69, and 80 (see FIGS. 11 and 12).

Eventually, the width dimension of the coupling bar portion 80 is a smaller dimension than the width dimension of the coupling bar portion 69 of the first plunger 62.

The tip end inserting portion 81 is a part to guide insertion of the coupling bar portion 80 in the compression coil spring 64. The tip end inserting portion 81 is formed at the tip end portion (lower end portion in FIG. 14) of the coupling bar portion 80. The tip end inserting portion 81 has a gentle and curved sloped surface not to be an obstacle in an inserting direction to facilitate smooth insertion in the compression coil spring 64. Thus, in a state where one coupling bar portion 80 is piled on one side of the coupling bar portion 69 of the first plunger 62, that is, in a state where the coupling bar portion 69 of the first plunger 62 and the coupling bar portion 80 of one second plunger 63 are inserted in the coil spring 64 in advance, in order for the coupling bar portion 80 of the other second plunger 63 to be inserted in the coil spring 64 lastly, smooth insertion of the tip end inserting portion 81 of the other coupling bar portion 80 in the compression coil spring 64 is facilitated.

The falling preventing portion 82 is a part to prevent the tip end inserting portion 81 from falling off from the compression coil spring 64 when the tip end inserting portion 81 is inserted in the compression coil spring 64. The falling preventing portion 82 is provided at the proximal end portion (border part between the coupling bar portion 80 and the tip end inserting portion 81) of the tip end inserting portion 81. The falling preventing portion 82 is formed by projecting the proximal end portion of the tip end inserting portion 81 to both sides. The width of the falling preventing portion 82 projected to both sides is set to be slightly protruded from the inside diameter of the adhesion small-diameter portion 84 at the end portion of the compression coil spring 64 at the time of assembling (see FIG. 12). That is, it is set, in a state where the two coupling bar portions 80 are piled on both sides of the coupling bar portion 69 of the first plunger 62, so that the four corner portions (respective two corner portions located outside of the falling preventing portions 82 shown in FIG. 12) located outside of the two falling preventing portions 82 overlapped on both sides of the coupling bar portion 69 may be slightly protruded from the inside diameter of the adhesion small-diameter portion 84 at the end portion of the compression coil spring 64.

The spring receiving portion 76 is a part to receive the compression coil spring 64. The spring receiving portion 76 is a step provided at a border part between the coupling portion 75 and the contact piece 77. The contact piece 77 is formed to have a larger width than the width of the coupling portion 75, and a step part at their border is the spring receiving portion 76. The adhesion small-diameter portion 84 at the end portion of the compression coil spring 64 abuts on this spring receiving portion 76 to cause the second plunger 63 to be elastically supported in the contact 22 by the compression coil spring 64.

The contact piece 77 is a member to contact the other member (bump electrode 13) and be electrically connected to it. The contact piece 77 is provided integrally following the proximal end side (upper side in FIG. 14) of the coupling portion 75. The contact piece 77 is formed by an approximately rectangular plate-shaped portion whose width dimension is a slightly smaller dimension than the inside diameter of the second supporting hole 17A of the upper housing 17 and a tip end portion having a smaller width dimension than it and having a width dimension passing through the upper receiving portion 17B of the upper housing 17 and entering the narrowing portion 57 of the guide plate 19. In the contact piece 77, the upper supporting shoulder portion 79 is formed at the border between the rectangular plate-shaped portion and the tip end portion. This upper supporting shoulder portion 79 hangs on the upper receiving portion 17B of the upper housing 17 to prevent the contact piece 77 from falling off from the second supporting hole 17A. In a state where the upper supporting shoulder portion 79 hangs on the upper receiving portion 17B of the upper housing 17, the upper end portion (see FIG. 14) of the contact piece 77 is adapted to protrude upward from the second supporting hole 17A.

Figure 16:
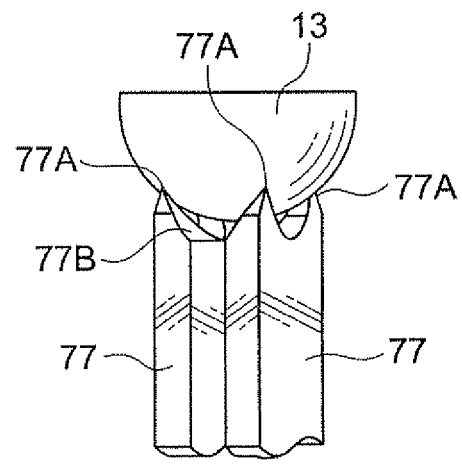
FIG. 16 is a perspective view showing a state where projections of contact pieces of the contact according to the first embodiment of the present invention bite into a bump electrode.
Figure 17:
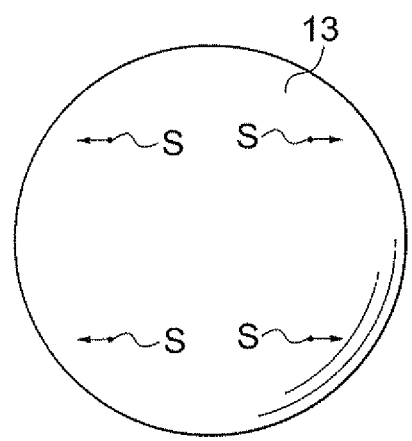
FIG. 17 is a plan view showing marks of the projections of the contact pieces of the contact according to the first embodiment of the present invention which have bit into the bump electrode.
Figure 18:
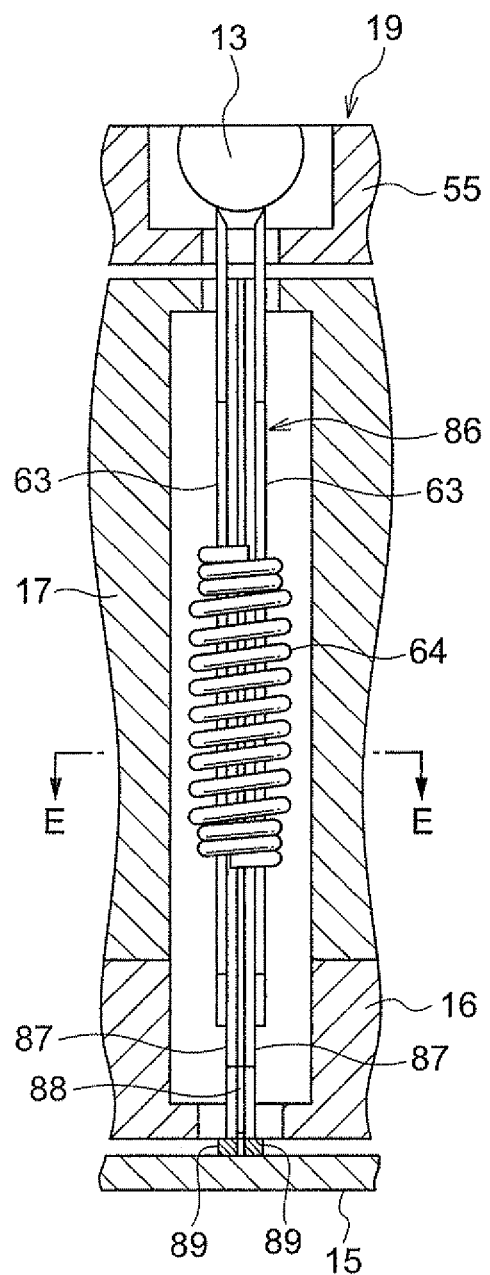
FIG. 18 is a main part enlarged cross-sectional view showing a contact mounting part of an electrical connecting apparatus according to a second embodiment of the present invention.

The tip end of the upper end portion of each contact piece 77 is formed in two projected shapes. That is, the center of the tip end of the contact piece 77 is dented in a U shape and is formed to be a recess, on both sides of which the two projections 77A are formed. Also, in the projection 77A is formed a tapered surface 77B (see FIG. 10). Thus, the two projections 77A are formed in two cutting edge shapes. A space formed by the recesses and the two pairs of opposed tapered surfaces 77B acts as a space to receive the top of the bump electrode 13. Thus, at the time of contact between the bump electrode 13 and the second plungers 63, the top of the bump electrode 13 is received in the space and contacts the tip end surfaces of the second plungers 63 to be prevented from being crushed. The tapered surfaces 77B are disposed in directions to mutually open upward when the two second plungers 63 are opposed to sandwich the first plunger 62 (see FIGS. 10 and 16). Accordingly, the two pairs of projections 77A disposed in directions to mutually open upward are adapted to contact the bump electrode 13 reliably as shown in FIG. 16 and sting the bump electrode 13 respectively with four contact points S as shown in FIG. 17 for reliable electrical contact.

In addition, the tapered surfaces 77B are adapted to exert the following function. When the two pairs of projections 77A are to contact the bump electrode 13, the projections 77A intend to slide on the spherical surface of the bump electrode in the circumferential direction, and a force to make the projections 77A in each pair move in directions away from each other acts. The force acts as a force to press the coupling portions 75, especially the tip end inserting portions 81, located opposite the projections 77A of the second plungers to the first plunger 62. At this time, by the fact that the respective projections 77A are pressed to the bump electrode 13, the second plungers 63 are displaced downward. This causes the first plunger 62 and the second plungers 63 to mutually scrape and slide while being pressed relatively at the coupling portions 66 and 75 for reliable contact.

Figure 15:
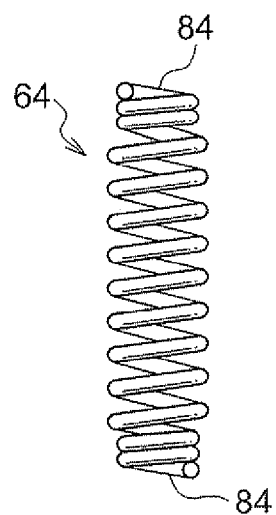
FIG. 15 is a front view showing a compression coil spring of the contact according to the first embodiment of the present invention.

The compression coil spring 64 is a member to cover the outer circumferences of the coupling bar portions 69 and 80 of the first plunger 62 and the second plungers 63, abut on the respective spring receiving portions 67 and 76 to support the respective plungers 62 and 63 elastically, and conduct electricity between the plungers 62 and 63 as shown in FIG. 15. The coupling portions 66 and 75 of the first plunger 62 and the second plungers 63 are piled and supported at both ends of the compression coil spring 64.

As for the compression coil spring 64, an intermediate portion thereof is formed to have a large diameter, that is, a size that does not allow abutment of the cross-sectional shape formed by the coupling bar portion 69 of the first plunger 62 and the coupling bar portions 80 of the second plungers 63 sandwiching it (see FIG. 11), and constitutes a compression coil spring. The outside diameter of the intermediate portion is set to be slightly larger than the maximum width dimension of the first plunger 62 and the second plungers 63. At both ends of the compression coil spring 64 are formed the adhesion small-diameter portions 84 having small diameters. The inside diameter of each of the adhesion small-diameter portions 84 is set to be slightly smaller than the diameter of the circumscribed circle circumscribing the cross-sectional shape formed by the coupling bar portion 69 of the first plunger 62 and the coupling bar portions 80 of the two second plungers 63 sandwiching it.

Accordingly, as for the contact 20, one first plunger 62 and two second plungers 63 are overlapped at the coupling portions 66 and 75 in a state where their contact pieces 68 and 77 are in opposite directions from one another, are integrated by the compression coil spring 64, lock the compression coil spring 64 at positions of the respective spring receiving portions 67 and 76 not to be separable, and are assembled to be slidable on one another.

The contact 20 configured as above is used in the following manner.

First, the device under test 12 is mounted in the electrical connecting apparatus 11. At this time, the device under test 12 is mounted in the receiving recess portion 53 of the guide plate 19. That is, the device under test 12 is mounted on the bottom plate portion 55 while being positioned along the sloped surface 53B of the upper opening 53A. Thus, the bump electrodes 13 of the device under test 12 are received in the guide holes 56 of the bottom plate portion 55. Also, the upper end portions of the contact pieces 77 of the contacts 20 are received in the narrowing portions 57.

Figure 9:
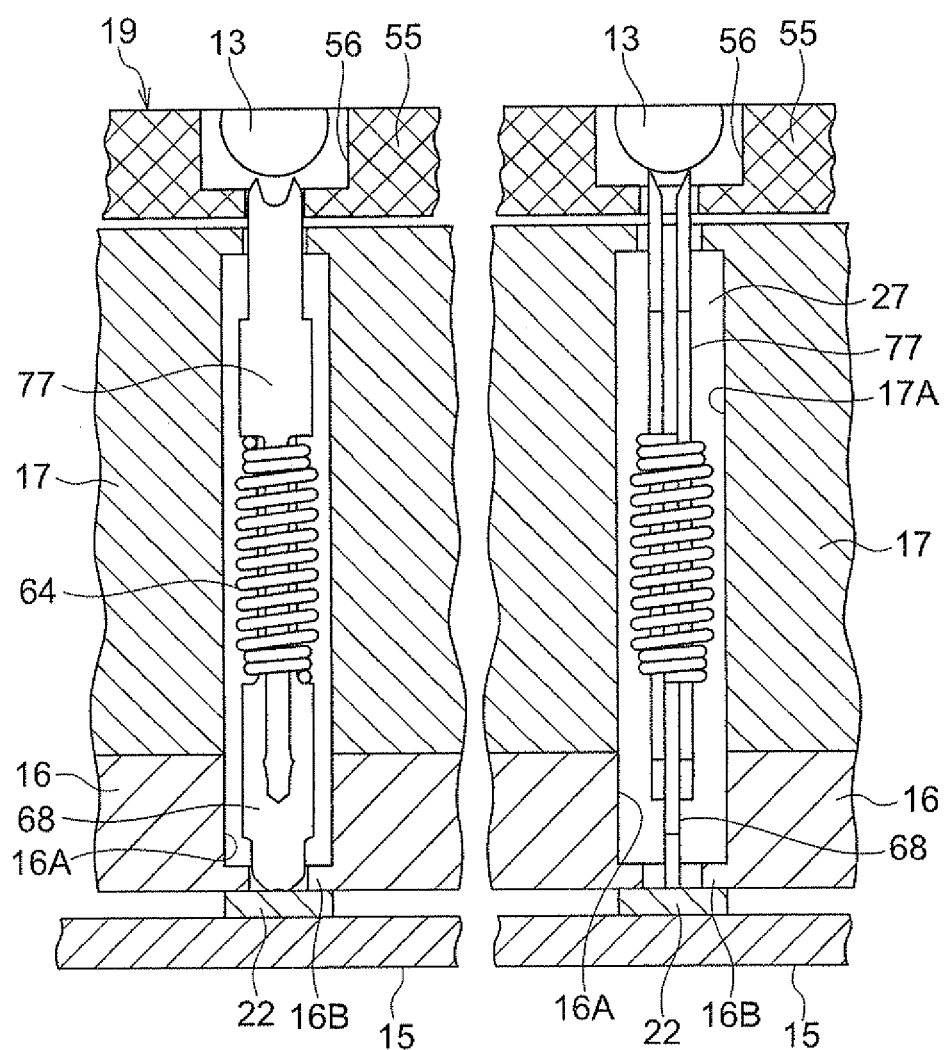
FIG. 9 shows main part enlarged cross-sectional views each showing the contact mounting part of the electrical connecting apparatus according to the first embodiment of the present invention, which are a front cross-sectional view and a side cross-sectional view each showing a state where the contact contacts the electrode of the device under test.
Figure 10:
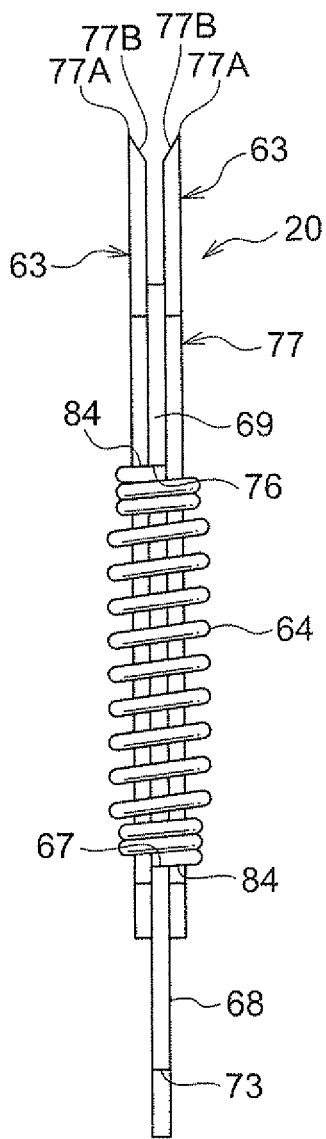
FIG. 10 is a side view showing the contact according to the first embodiment of the present invention.
Figure 11:
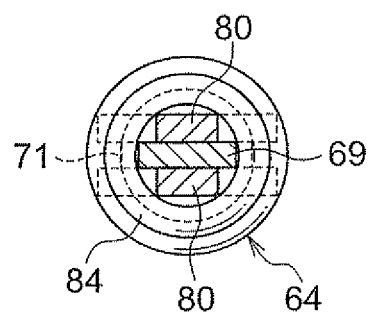
FIG. 11 is a cross-sectional view taken along arrow C-C of FIG. 1.
Figure 12:
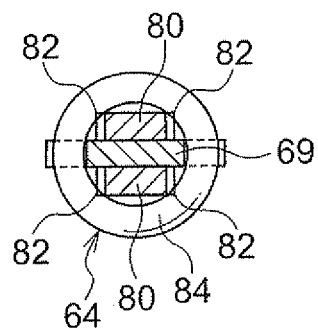
FIG. 12 is a cross-sectional view taken along arrow D-D of FIG. 1.
Figure 13:
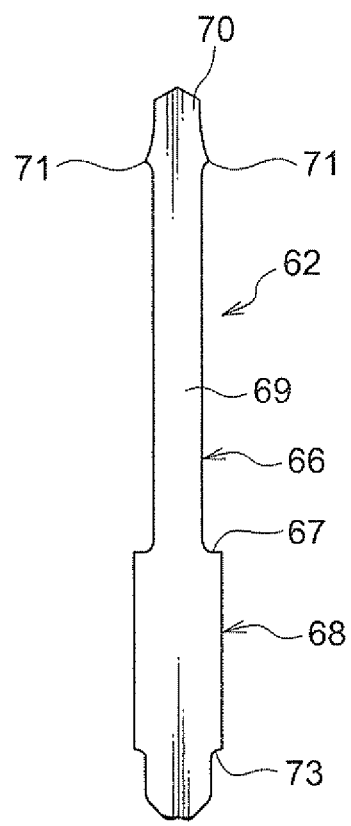
FIG. 13 is a front view showing a first plunger of the contact according to the first embodiment of the present invention.
Figure 14:
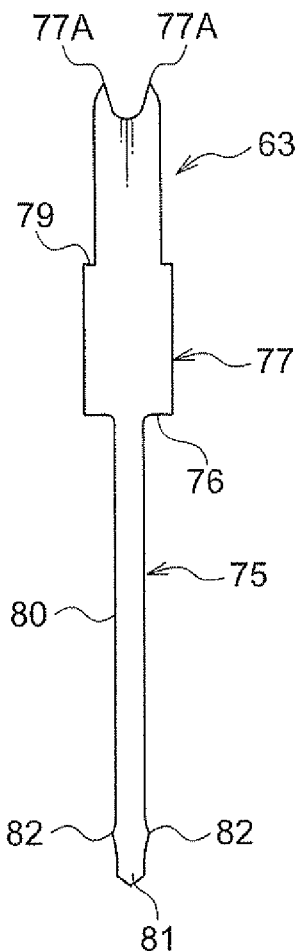
FIG. 14 is a front view showing a second plunger of the contact according to the first embodiment of the present invention.

In this state, when the device under test 12 is pressed down, each bump electrode 13 contacts the projections 77A of the two respective second plungers 63 from the state in FIG. 8 to the state in FIG. 9, and each contact 20 is compressed.

When the projections 77A at the tip ends of the two contact pieces 77 of the two second plungers 63 are to contact the bump electrode 13, the projections 77A intend to slide on the spherical surface of the bump electrode in the circumferential direction, force to make the projections 77A in each pair move in directions away from each other acts, and the force acts as a force to press the coupling portions 75, especially the tip end inserting portions 81, located opposite the projections 77A of the second plungers to the first plunger 62 in combination with the fact that the respective coupling bar portions 69 and 80 are supported at the adhesion small-diameter portions of the compression coil spring 64. This causes the first plunger 62 and the second plungers 63 to scrape and slide while being pressed relatively therebetween for reliable electrical contact. Further, at this time, as for the compression coil spring 64, the adhesion small-diameter portions 84 at both ends are brought into pressure contact with the spring receiving portion 67 of the first plunger 62 and the spring receiving portions 76 of the second plungers 63, respectively, for reliable electrical contact at the respective parts.

Also, the two second plungers 63 are adapted to slide independently, and thus even in a case where the heights of the contact parts to the projections 77A of the two second plungers 63 differ such as a case where the bump electrode 13 is deformed, the two second plungers 63 follow the shape and contact it while being displaced.

This causes the respective members (the wiring board 15 and the bump electrodes 13) to be electrically connected reliably by the contacts 20. In this state, electrical signals and the like are transmitted between the respective members via the contacts 20.

As described above, since the first plunger 62 and the second plungers 63 electrically contact one another reliably, and an electrically conducting state is maintained between the compression coil spring 64 and each of the plungers 62 and 63 as well, electrical contact characteristics between the respective members (the wiring board 15 and the bump electrodes 13) are drastically improved.

Also, since the contact 20 has few causes for failures because it has a small number of parts and has a simple structure, durability is improved. Each plunger can be manufactured easily by press work or the like since it is formed in a plate shape, and cost reduction is enabled since the contact 20 has a simple structure and has a small number of parts.

Also, since the device under test 12 can be mounted in the electrical connecting apparatus 11 easily and accurately, and the electrodes of the device under test 12 will not be damaged, test operability is improved, and test accuracy is improved.

Since the contact 20 has a small number of parts and has a simple structure, the electrical contact characteristics can be maintained in favorable conditions for a long period, and the durability is improved. Consequently, reliability of the contact 20 and the electrical connecting apparatus 11 is improved.

Second Embodiment

Next, a contact according to a second embodiment of the present invention will be described. The contact of the present embodiment is one in which two first plungers are provided in the contact 20 of the first embodiment and in which Kelvin contact is constituted. The overall configuration of the contact of the present embodiment is almost similar to that of the contact 20 of the first embodiment. That is, a contact 86 of the present embodiment is similar to the first embodiment in terms of the other members except that first plungers 87 have different structures, and that the material for the compression coil spring 64 is insulated. Thus, identical components are shown with the same reference numerals, and description of the duplicate components is omitted.

Figure 19:
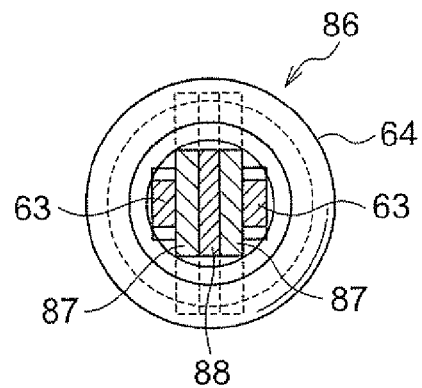
FIG. 19 is a cross-sectional view taken along arrow E-E of FIG. 18.
Figure 20:
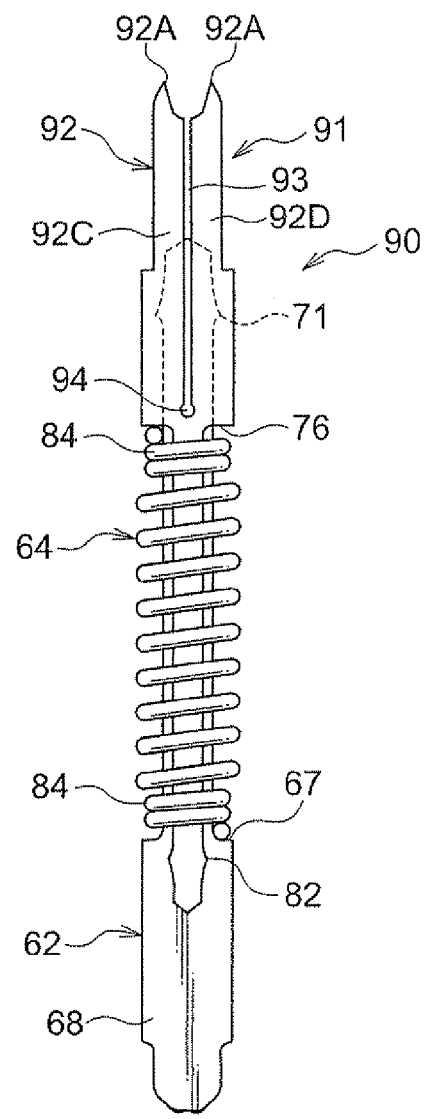
FIG. 20 is a front view showing a contact according to a third embodiment of the present invention.
Figure 21:
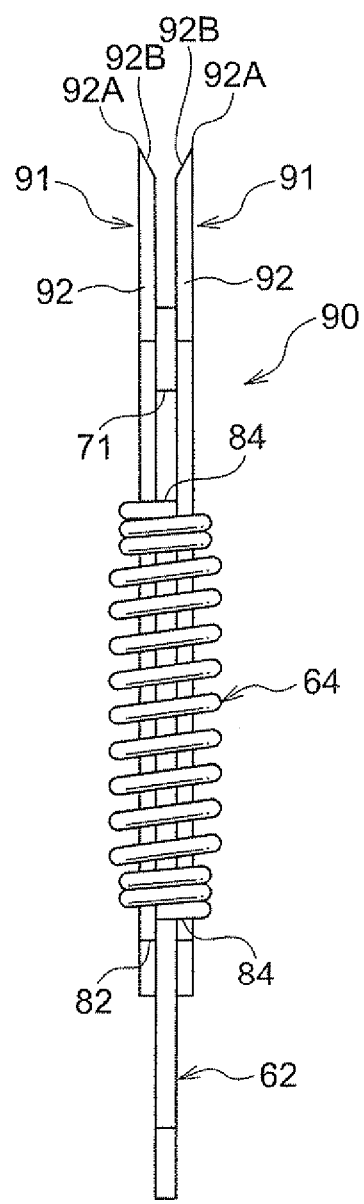
FIG. 21 is a side view showing the contact according to the third embodiment of the present invention.
Figure 22:
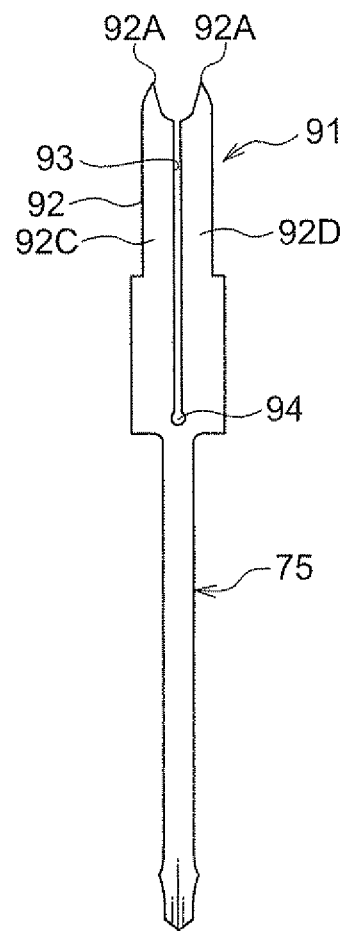
FIG. 22 is a front view showing a second plunger of the contact according to the third embodiment of the present invention.

In the contact 86 of the present embodiment, two first plungers 87 are provided in a similar manner to that of the second plungers 63. The two first plungers 87 have equal shapes, and an insulator 88 is provided between the respective first plungers 87. The insulator 88 has only to be a plate-shaped member that can insulate the two first plungers 87 from each other. This insulator 88 insulates the two first plungers 87 from each other and the two second plungers 63 brought into contact with the respective first plungers 87 from each other, respectively. These are supported integrally in a state of being insulated by the compression coil spring 64. As for the dimensions of the first plungers 87 and the second plungers 63, parts corresponding to the contact piece 68 and the falling preventing portion 71 of the first embodiment are set to be slightly larger than the adhesion small-diameter portion 84 of the compression coil spring 64 to prevent falling as shown in FIG. 19.

As for the adhesion small-diameter portion 84, an inside diameter portion thereof is set to be a circumscribed circle circumscribing the insulator 88, the two first plungers 87, and the two second plungers 63 in a state where these are piled. The adhesion small-diameter portion 84 is insulated from the first plungers 87 and the second plungers 63. To correspond to it, two contact pads 89 of the wiring board 15 are provided.

The compression coil spring 64 is made of an insulating material such as ceramic or an engineering plastic. Alternatively, it may be made by providing a normal metallic spring material with insulated coating.

Accordingly, one first plunger 87 and one second plunger 63 are electrically connected, and the other first plunger 87 and the other second plunger 63 are electrically connected, to transmit signals by two lines.

In each line, similar effects are exerted to those of the first embodiment, and electrical contact characteristics are drastically improved. In addition, Kelvin contact can be performed reliably.

Third Embodiment

Next, a contact and an electrical connecting apparatus according to a third embodiment of the present invention will be described. It is to be noted that, since the electrical connecting apparatus of the present embodiment is configured similarly to the electrical connecting apparatus of the first embodiment, the contact will be described here mainly.

The contact according to the present embodiment is configured to improve the contact piece 77 of each second plunger 63 of the contact 20 of the first embodiment and support four projections contacting the bump electrode 13 to be able to approach to and separate from one another freely in the radial directions or the like. It is to be noted that, since the overall configuration of the contact of the present embodiment is almost similar to that of the contact 20 of the first embodiment, identical components are shown with the same reference numerals, and description of the duplicate components is omitted.

A contact piece 92 of a second plunger 91 of a contact 90 of the present embodiment has two projections 92A as shown in FIGS. 20 to 23. Each projection 92A is configured similarly to the projection 77A of the first embodiment and has a tapered surface 92B. The contact piece 92 is also provided with a slit 93. Thus, the contact piece 92 is formed in a bifurcated shape. Specifically, the slit 93 is provided between the two projections 92A of the contact piece 92. This slit 93 is provided almost over the entire length of the contact piece 92 in the longitudinal direction of the contact piece 92 from the middle of the two projections 92A. At the end portion on the back side of the slit 93 is provided a stopping hole 94 that is a circular through hole to prevent cracks caused by concentration of stress.

Thus, the contact piece 92 is formed in a bifurcated shape by the slit 93. The respective parts of the bifurcation are two projection bar portions 92C and 92D provided at the tip end portions with the respective projections 92A. Thus, the two projection bar portions 92C and 92D are flexed to open and close centering on the part of the stopping hole 94 and to separate the two projections 92A, that is, to make the two projections 92A approach to and separate from each other.

The second plungers 91 are disposed to sandwich the first plunger 62 on both sides. Thus, the contact pieces 92 of the respective second plungers 91 are disposed to be opposed to each other. Thus, the two projections 92A of each contact piece 92 (four projections 92A in total) are supported to be able to approach to and separate from one another freely. That is, the four projections 92A respectively supported by the four projection bar portions 92C and 92D flexed individually are supported to be able to approach to and separate from one another freely in the radial directions or the like.

Figure 24:
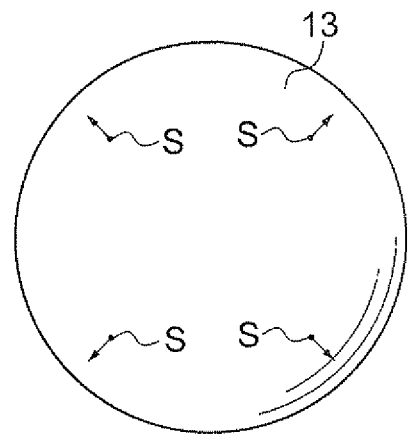
FIG. 24 is a plan view showing directions in which the projections of the contact pieces of the contact according to the third embodiment of the present invention bite into the bump electrode and are displaced.

With the above configuration, when the four projections 92A contact the bump electrode 13 at four contact points S as shown in FIG. 24, the four projections 92A separate from one another to open in the radial directions by the semi-spherical bump electrode 13. In the first embodiment, there are two pairs of contact points S of the two projections 77A whose distance does not change, and the respective pairs separate to open rightward and leftward, as shown in FIG. 17. On the other hand, in the case of the present embodiment, the four contact points S separate from one another to open in the radial directions as described above.

As a result, the four projections 92A sting the bump electrode 13 while separating to open in the radial directions for reliable electrical contact.

Meanwhile, depending on angles at which the four projections 92A contact the bump electrode 13, the tapered surfaces 92B may be brought into pressure contact with the bump electrode 13. The same applies to the first embodiment.

Figure 23:
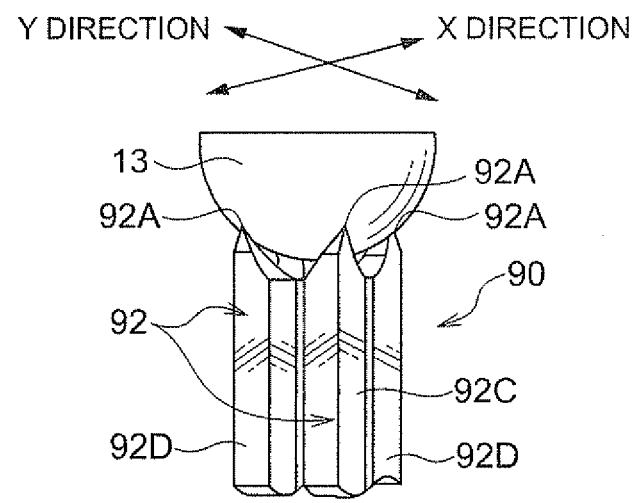
FIG. 23 is a perspective view showing a state where projections of contact pieces of the contact according to the third embodiment of the present invention bite into the bump electrode.

Also, in a case where the contact 90 and the bump electrode 13 are brought into contact with each other at a mutually displaced position (for example, a displaced position in the X direction or the Y direction in FIG. 23), the projection bar portions 92C and 92D are flexed to absorb the displacement. Specifically, when the contact 90 and the bump electrode 13 contact at a mutually displaced position (for example, a displaced position in the right direction in FIG. 23), the projection bar portion 92D placed forward (forward in the right direction in FIG. 23) in a direction in which the bump electrode 13 is displaced against the contact 90 (hereinafter referred to as "displaced direction") is flexed significantly in the displaced direction. On the other hand, the projection bar portion 92D placed backward in the displaced direction is not flexed much. Accordingly, the four projections 92A supported by the four projection bar portions 92C and 92D contact the bump electrode 13 reliably. That is, in a case where the contact 90 and the bump electrode 13 are displaced from each other, the projection bar portions 92C and 92D are flexed and absorb the displacement.

This enables the contact 90 to electrically contact the bump electrode 13 reliably.

MODIFICATION EXAMPLE

In the first embodiment, although the compression coil spring 64 has a large diameter at the intermediate portion and forms the adhesion small-diameter portions 84 having small diameters at both end portions, the compression coil spring 64 may be in a barrel shape having a large diameter at the intermediate portion, formed to be gradually smaller in diameter toward both ends, and forming at both the end portions the adhesion small-diameter portions 84 having smallest diameters or in another shape.

In the first embodiment, although the inside diameter of the adhesion small-diameter portion 84 is set to be slightly smaller than the diameter of the circumscribed circle circumscribing the cross-sectional shape of the first plunger 62 and the second plungers 63 in a state where respective coupling portions thereof are overlapped, it may be set to be equal to the diameter of the circumscribed circle. Alternatively, the inside diameter of the adhesion small-diameter portion 84 may be set to be considerably smaller than the diameter of the circumscribed circle. It has only to be a diameter enabling the first plunger 62 and the second plungers 63 to be kept conductive and supported to be slidable relatively.

In the first embodiment, although two second plungers 63 and one first plunger 62 are provided, one second plunger 63 and one first plunger 62 may be provided. In this case, one second plunger 63 and one first plunger 62 are supported at the adhesion small-diameter portions 84 at both ends of the compression coil spring 64 to constitute the contact. Alternatively, one second plunger 63 and two first plungers 62 may be provided. In any of these cases, similar effects can be exerted to those of the first embodiment. Also, this aspect is similarly applied to the contact 90 in the third embodiment.

Figure 25:
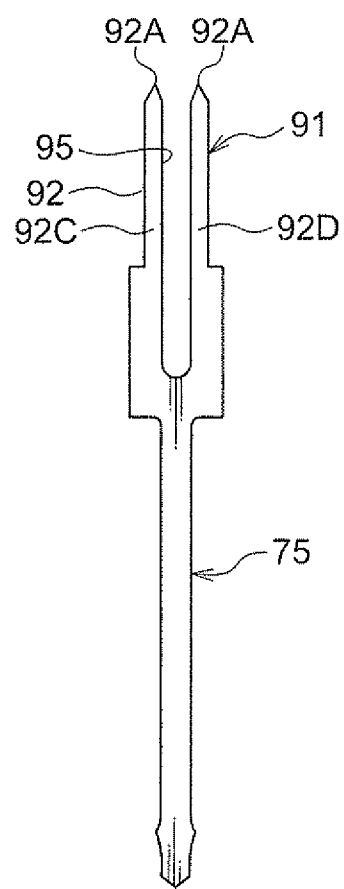
FIG. 25 is a side view showing a modification example of the second plunger of the contact according to the third embodiment of the present invention.

In the third embodiment, although the slit 93 having a small groove width is provided in the contact piece 92, the groove width can be set properly in accordance with various conditions such as a force to support the projections 92A. For example, as shown in FIG. 25, a U-shaped slit 95 having a large groove width may be provided. The end portion on the back side of the slit 95 is formed in a semicircular shape to prevent concentration of stress. Thus, the projection bar portions 92C and 92D can be made to be flexed with smaller force than in the case of the slit 93 of the third embodiment. The width of the slit 95 is set properly in accordance with various conditions such as a size and hardness of the bump electrode 13. In this case as well, similar effects can be exerted to those of the third embodiment.

Also, in the third embodiment and the aforementioned modification example, although the slit 93 or 95 is provided on the side of the second plunger 91, it may be provided on the side of the first plunger 62. In a case where it is preferable to provide the slit 93 or 95 by conditions in which the electrode for contact is curved or the like, the projections 92A and the slit 93 or 95 may be provided on the side of the first plunger 62.

Also, in the third embodiment and the aforementioned modification example, although two projections 92A and one slit 93 or 95 are provided, three or more projections 92A and two or more slits 93 or 95 may be provided. It is set properly in accordance with various conditions such as a size of the bump electrode 13.

INDUSTRIAL APPLICABILITY

The contact of the present invention can be used in general apparatuses that are brought into contact with electrodes provided in a wiring board, a semiconductor integrated circuit, or the like.

The electrical connecting apparatus can be applied to all apparatuses that can use the contact of the present invention.

The invention claimed is:

1. A contact comprising:
   a plate-shaped first plunger contacting one member;
   a plate-shaped second plunger contacting the other member with a large area in a state of being overlapped with the first plunger at the plates and conducting electricity between the one member and the other member in cooperation with the first plunger; and
   a compression coil spring which is a member coupling the first plunger with the second plunger in a state where contact pieces thereof are in opposite directions from each other, covering outer circumferences of coupling portions of the first plunger and the second plunger, abutting on spring receiving portions of the respective plungers, and supporting the respective plungers to be relatively slidable; wherein,
   as for the compression coil spring, an intermediate portion thereof is a compression coil spring having a large diameter, and both end portions thereof are constituted by adhesion small-diameter portions which are adhesion coil springs having small diameters, and wherein
   an inside diameter of each of the adhesion small-diameter portions at both end portions is set to be equal to or smaller than a diameter of a circumscribed circle circumscribing a cross-sectional shape of the respective coupling portions of the first plunger and the second plunger in a state of being overlapped; wherein
   one of the first plunger and the second plunger, and two of the other are provided, the coupling portion of the one plunger is configured to be sandwiched between the coupling portions of the other two plungers, and a width dimension of the coupling portion of the one plunger is larger than width dimensions of the coupling portions of the other two plungers.

2. The contact according to claim 1, wherein each of the first and second plungers includes the coupling portion and the contact piece having a larger width dimension than that of the coupling portion, and the spring receiving portion is a step provided at a border part between the coupling portion and the contact piece.

3. The contact according to claim 1, wherein the other two plungers slide independently of each other in a state of sandwiching the one plunger.

4. The contact according to claim 1, wherein tip ends of the contact pieces of the other two plungers have tapered surfaces in mutually opening directions.

5. The contact according to claim 1, wherein the tip ends of the contact pieces of the other two plungers are provided with recesses, each of which is formed in two cutting edge shapes.

6. The contact according to claim 1, wherein the coupling portion of each of the first and second plungers is provided at an end portion opposite the spring receiving portion with a falling preventing portion.

7. The contact according to claim 1, wherein the contact piece of the first plunger or the second plunger is provided with a plurality of projections, between which a slit is provided to separate the respective projections.

8. The contact according to claim 7, wherein by the slit are formed a plurality of projection bar portions respectively provided at tip end portions with the respective projections, and the respective projection bar portions support the respective projections and are flexed freely.

9. An electrical connecting apparatus contacting electrodes of a device under test and performing a test, comprising:
   contacts disposed at positions corresponding to the respective electrodes of the device under test and contacting the respective electrodes for electrical conduction,
   wherein as the contacts are used the contacts according to claim 1.

* * * * *